(12) United States Patent
Shang et al.

(10) Patent No.: US 12,327,600 B2
(45) Date of Patent: Jun. 10, 2025

(54) MEMORY WITH ERROR CHECKING AND CORRECTING UNIT

(71) Applicant: CHANGXIN MEMORY TECHNOLOGIES, INC., Hefei (CN)

(72) Inventors: Weibing Shang, Hefei (CN); Hongwen Li, Hefei (CN); Liang Zhang, Hefei (CN); Kangling Ji, Hefei (CN); Sungsoo Chi, Hefei (CN); Daoxun Wu, Hefei (CN); Ying Wang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 18/393,820

(22) Filed: Dec. 22, 2023

(65) Prior Publication Data

US 2024/0145022 A1 May 2, 2024

Related U.S. Application Data

(63) Continuation of application No. 17/481,413, filed on Sep. 22, 2021, now Pat. No. 11,894,089, which is a
(Continued)

(30) Foreign Application Priority Data

Sep. 18, 2020 (CN) .......................... 202010988666.6

(51) Int. Cl.
*G11C 29/10* (2006.01)
*G11C 29/02* (2006.01)
(Continued)

(52) U.S. Cl.
CPC ............ *G11C 29/42* (2013.01); *G11C 29/026* (2013.01); *G11C 29/10* (2013.01); *G11C 29/4401* (2013.01); *G11C 2029/1204* (2013.01)

(58) Field of Classification Search
CPC ....... G11C 29/42; G11C 29/026; G11C 29/10; G11C 29/4401; G11C 2029/1204;
(Continued)

(56) References Cited

U.S. PATENT DOCUMENTS

| 4,509,172 A | 4/1985 | Chen |
| 5,966,389 A | 10/1999 | Kiehl |

(Continued)

FOREIGN PATENT DOCUMENTS

| CN | 1404065 A | 3/2003 |
| CN | 1771565 A | 5/2006 |

(Continued)

OTHER PUBLICATIONS

Extended European Search Report in U.S. Appl. No. 21/868,246, mailed on May 16, 2024.
(Continued)

*Primary Examiner* — Xiaochun L Chen
(74) *Attorney, Agent, or Firm* — Sheppard Mullin Richter & Hampton LLP

(57) ABSTRACT

A memory is provided. The memory includes: a storage array that includes multiple bit lines, each of the multiple bit lines is connected to multiple storage cells in the storage array; multiple column select signal units that are connected to sensitive amplifiers, the sensitive amplifiers and the multiple bit lines are disposed in one-to-one correspondence; local data buses that are divided into local data buses O and local data buses E, adjacent bit lines are electrically connected to a respective local data bus O and a respective local data bus E, respectively, through a respective sensitive amplifier and a respective column select signal unit; and a first error checking and correcting unit and a second error checking and correcting unit that are configured to check and correct errors of data.

20 Claims, 9 Drawing Sheets

Related U.S. Application Data continuation of application No. PCT/CN2021/106114, filed on Jul. 13, 2021.

(51) Int. Cl.
  *G11C 29/42* (2006.01)
  *G11C 29/44* (2006.01)
  *G11C 29/12* (2006.01)

(58) Field of Classification Search
  CPC . G11C 5/025; G11C 11/4063; G11C 11/4096; G11C 2029/0411
  See application file for complete search history.

(56) References Cited

U.S. PATENT DOCUMENTS

| | | | |
|---|---|---|---|
| 6,510,537 | B1 | 1/2003 | Lee |
| 7,134,069 | B1 | 11/2006 | Longwell |
| 7,203,115 | B2 | 4/2007 | Eto |
| 7,644,348 | B2 | 1/2010 | Longwell |
| 8,069,394 | B2 | 11/2011 | Kanno |
| 8,086,933 | B2 | 12/2011 | Yamaga |
| 8,117,517 | B2 | 2/2012 | Kanno |
| 8,196,008 | B2 | 6/2012 | Kanno |
| 8,381,066 | B2 | 2/2013 | Yamaga |
| 8,386,881 | B2 | 2/2013 | Kanno |
| 8,499,216 | B2 | 7/2013 | Yamaga |
| 8,732,544 | B2 | 5/2014 | Kanno |
| 8,751,896 | B2 | 6/2014 | Yamaga |
| 8,959,411 | B2 | 2/2015 | Kanno |
| 9,384,090 | B2 | 7/2016 | Kanno |
| 11,038,536 | B2 | 6/2021 | Kanno et al. |
| 11,048,584 | B2 | 6/2021 | Jeon |
| 11,169,876 | B2 | 11/2021 | Ishikawa et al. |
| 2003/0046632 | A1 | 3/2003 | Hatakenaka et al. |
| 2003/0086306 | A1 | 5/2003 | Takahashi |
| 2004/0117723 | A1 | 6/2004 | Foss |
| 2006/0056258 | A1 | 3/2006 | Eto |
| 2006/0200728 | A1 | 9/2006 | Nagai |
| 2007/0038919 | A1 | 2/2007 | Sekiguchi et al. |
| 2007/0198902 | A1 | 8/2007 | Toda |
| 2007/0214403 | A1 | 9/2007 | Longwell |
| 2008/0005646 | A1* | 1/2008 | Bains .................. G06F 11/1008 714/E11.034 |
| 2008/0160303 | A1 | 7/2008 | Yim |
| 2009/0183052 | A1 | 7/2009 | Kanno |
| 2010/0083065 | A1 | 4/2010 | Longwell |
| 2010/0313099 | A1 | 12/2010 | Yamaga |
| 2011/0191651 | A1 | 8/2011 | Chen et al. |
| 2011/0197109 | A1 | 8/2011 | Kanno |
| 2011/0197110 | A1 | 8/2011 | Kanno |
| 2012/0072798 | A1 | 3/2012 | Unesaki |
| 2012/0166908 | A1 | 6/2012 | Yamaga |
| 2012/0221918 | A1 | 8/2012 | Kanno |
| 2013/0132795 | A1 | 5/2013 | Yamaga |
| 2013/0145230 | A1 | 6/2013 | Kanno |
| 2013/0297984 | A1 | 11/2013 | Yamaga |
| 2014/0215288 | A1 | 7/2014 | Kanno |
| 2015/0135035 | A1 | 5/2015 | Kanno |
| 2016/0041875 | A1 | 2/2016 | Kanno |
| 2016/0254059 | A1 | 9/2016 | Ochi |
| 2017/0141799 | A1 | 5/2017 | Kanno |
| 2019/0215015 | A1 | 7/2019 | Kanno |

FOREIGN PATENT DOCUMENTS

| | | |
|---|---|---|
| CN | 101211667 A | 7/2008 |
| CN | 101622603 A | 1/2010 |
| CN | 101946239 A | 1/2011 |
| CN | 102339641 A | 2/2012 |
| CN | 102436406 A | 5/2012 |
| CN | 110879759 A | 3/2020 |
| CN | 111078459 A | 4/2020 |
| JP | 2014096021 A | 5/2014 |
| TW | 201128653 A | 8/2011 |

OTHER PUBLICATIONS

International Search Report in the international application No. PCT/CN2021/106114, mailed on Sep. 29, 2021, 3 pages.
English translation of the Written Opinion of the International Search Authority in the international application No. PCT/CN2021/106114, mailed on Sep. 29, 2021, 3 pages.
Notice of Allowance of the Chinese application No. 202010988666.8, issued on Jun. 19, 2023, 8 pages with English translation.
Non-Final Office Action of the U.S. Appl. No. 17/481,413, issued on Aug. 31, 2023, 26 pages.
Communication under Rule 71(3) EPC dated Feb. 14, 2025, issued in related European Patent Application No. 21868246.6 (9 pages).

* cited by examiner

MEMORY WITH ERROR CHECKING AND CORRECTING UNIT

CROSS-REFERENCE TO RELATED APPLICATIONS

The present application is a continuation of U.S. patent application Ser. No. 17/481,413, filed on Sep. 22, 2021, entitled "Memory", which is a continuation of International Application No. PCT/CN2021/106114, filed on Jul. 13, 2021, entitled "Memory", which is based upon and claims priority to Chinese Patent Application No. 202010988666.8, filed on Sep. 18, 2020, entitled "Memory". The contents of U.S. patent application Ser. No. 17/481,413, International Application No. PCT/CN2021/106114, and Chinese Patent Application No. 202010988666.8 are incorporated herein by reference in their entireties.

BACKGROUND

A Dynamic Random Access Memory (DRAM) is a commonly used semiconductor memory in computers, and includes many repeated storage cells. Each storage cell usually includes a capacitor and a transistor. A gate electrode of the transistor is connected with a Word Line (WL), a drain electrode of the transistor is connected with a Bit Line (BL), and a source electrode of the transistor is connected with the capacitor. Voltage signals on the WLs can control the transistors to be turned on or off, so that the data information stored in the capacitor can be read through the BLs, or the data information can be written into the capacitor through the BLs for storage.

For the DRAM, data errors often occur during data storage, therefore, an Error Checking and Correcting (ECC) technology is needed to ensure the correctness of data storage. Usually, check bits are added on the basis of a certain length of valid data bits to check and correct error data.

SUMMARY

The embodiments of the present disclosure relate to, but are not limited to, a memory.

The embodiments of the present disclosure provide a memory. The memory includes a storage array, multiple column select signal units, local data buses, a first error checking and correcting unit and a second error checking and correcting unit.

The storage array includes multiple bit lines, and each of the multiple bit lines is connected to multiple storage cells in the storage array.

The multiple column select signal units are connected to sensitive amplifiers, and the sensitive amplifiers and the multiple bit lines are disposed in one-to-one correspondence.

The local data buses are divided into local data buses O and local data buses E, and adjacent bit lines are electrically connected to a respective local data bus O and a respective local data bus E, respectively, through a respective sensitive amplifier and a respective column select signal unit.

The first error checking and correcting unit and the second error checking and correcting unit are configured to check and correct errors of data. The local data buses O are electrically connected to the first error checking and correcting unit, and the local data buses E are electrically connected to the second error checking and correcting unit; or the local data buses E are electrically connected to the first error checking and correcting unit, and the local data buses O are electrically connected to the second error checking and correcting unit.

BRIEF DESCRIPTION OF THE DRAWINGS

One or more embodiments are exemplarily described with the reference of pictures in the corresponding drawings. These exemplary descriptions do not constitute a limitation on the embodiments. Elements with the same reference signs in the drawings represent similar elements. Unless otherwise stated, the figures in the drawings do not constitute a scale limitation.

DETAILED DESCRIPTION

It can be seen from the Background that the ECC technology in the related art is still deficient.

The analysis revealed that if there is a one-bit error in data, the ECC technology can not only find the error but also correct the error. The ECC technology can further find 2 to 4 bit errors. However, it is difficult for the ECC technology to correct errors of 2 bits and more bits. In other words, although the ECC technology can check and correct a single-bit error at the same time, the current ECC technology cannot help if errors in two or more bits of data are checked at the same time. Furthermore, further analysis revealed that at present, there is a higher probability of simultaneous errors in two bits that are in adjacent locations. Further analysis revealed that the main reasons for this problem are as follows.

Figure 1:
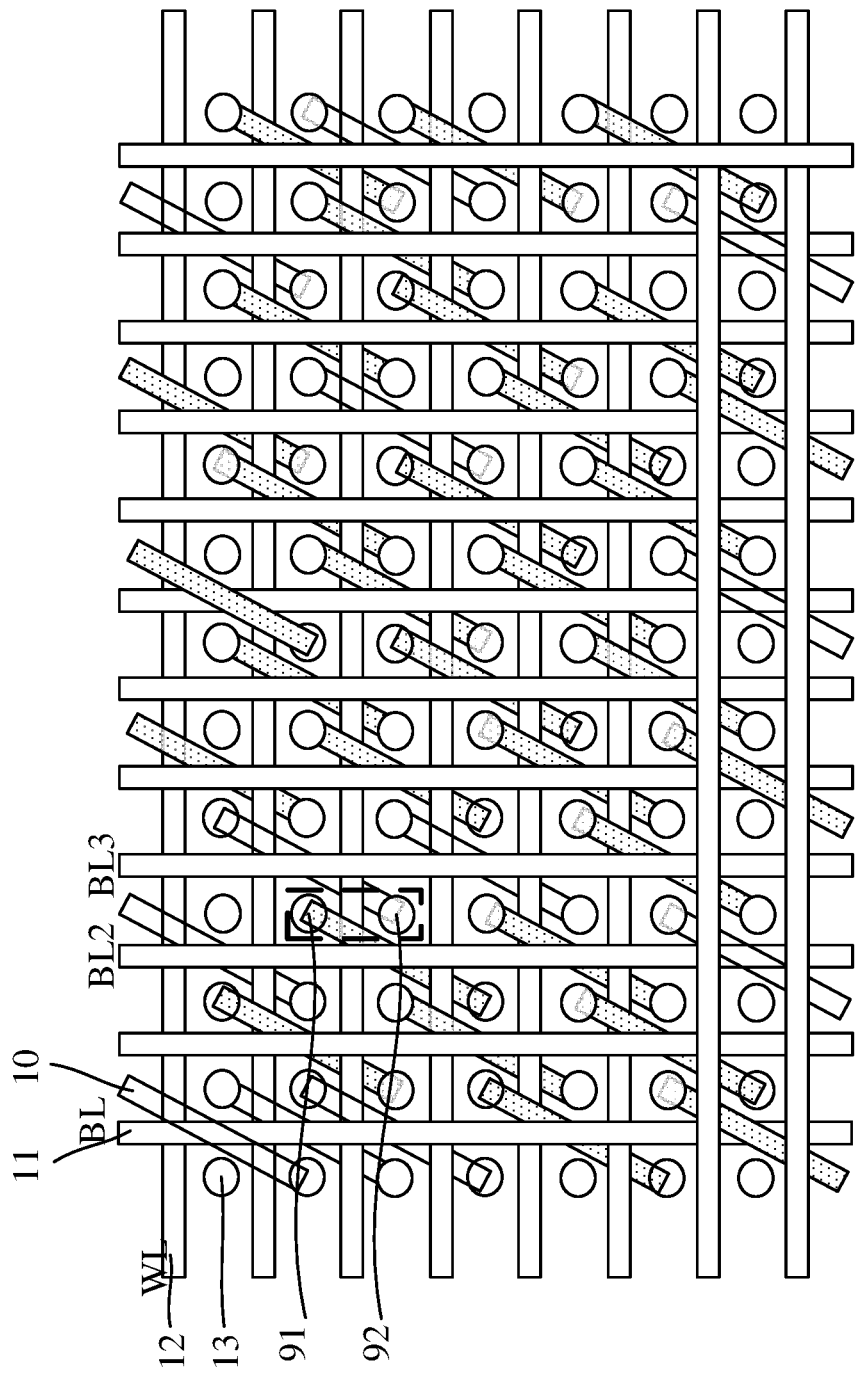
FIG. 1 is a structural schematic diagram of top view of a layout of a memory.

FIG. 1 is a structural schematic diagram of top view of a layout of a memory. The memory includes: multiple active regions 10 arranged in an array, bit lines 11, word lines 12, and capacitors 13 electrically connected with the active regions. There is the defect of cell to cell bridge, or called adjacent two bit errors, in the memory. For example, a bridge connection occurs between a capacitor 91 and a capacitor 92 corresponding to adjacent active regions 10 respectively. As illustrated in a dashed box in FIG. 1, the capacitor 91 is connected with a bit line BL3 through a transistor, and the capacitor 92 is connected with a bit line BL2 through a transistor. As the process size of the memory gets smaller, the probability of occurrence of such defect is increasing.

Figure 2:
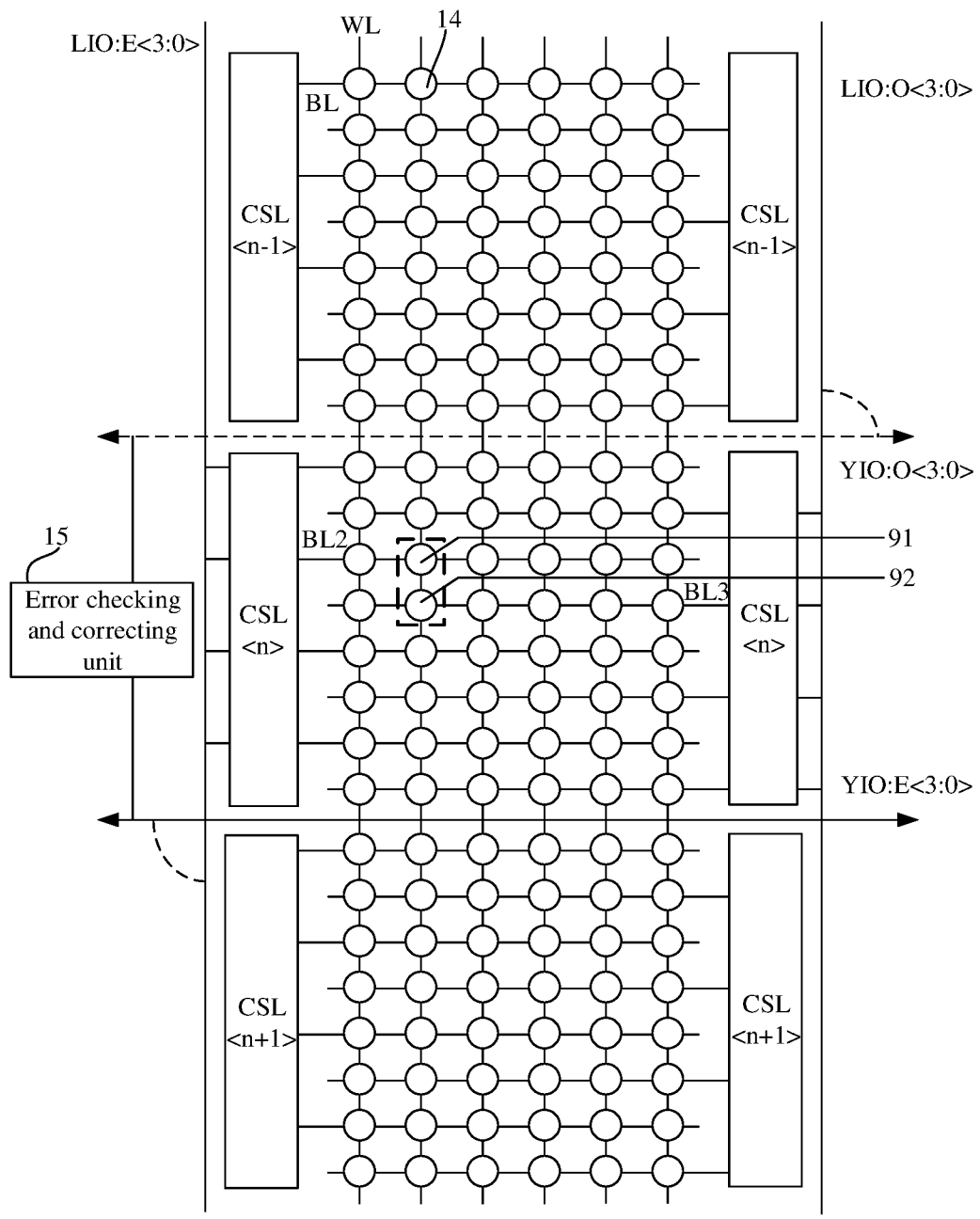
FIG. 2 is a structural schematic diagram of a memory.

FIG. 2 is a structural schematic diagram of a memory. The memory includes storage arrays, column select signal units, local data buses, and block data buses.

The storage arrays include storage cells 14. Each storage cell 14 is connected with a bit line BL and a word line WL.

Column select signal units are marked as CSL<n−1>, CSL<n> and CSL<n+1> in FIG. 2. Each column select signal unit includes multiple column select signal lines, and each column select signal line is connected with the corresponding bit line BL in the storage array through a switch. The control signal of the switches come from a column decoding circuit (not illustrated in FIG. 2, but marked as YDEC in FIG. 3) and is used to determine whether the data on the bit line BL is transmitted to local data buses. For example, the column select signal unit CSL<n> includes 8 column select signal lines, and the 8 column select signal lines are connected with 8 bit lines BL in the storage array through switches.

Local data buses are marked as LIO in FIG. 2. Herein LIO:O<3:0> indicates odd-numbered local data buses, and LIO:E<3:0> indicates even-numbered local data buses.

Block data buses are marked as YIO in FIG. 2. Herein YIO:O<3:0> indicates odd-numbered block data buses, and YIO:E<3:0> indicates even-numbered block data buses. The local data buses are connected with the block data buses through local switch circuits (such as local sensitive amplifying circuits, not illustrated in FIG. 2). In FIG. 2, arc curves indicate interaction between YIO:E<3:0> and LIO:E<3:0> and interaction between YIO:O<3:0> and LIO:O<3:0>.

In conjunction with FIG. 1 and FIG. 2, the block data buses YIO:E<3:0> and YIO:O<3:0> are connected to the same error checking and correcting unit 15. If two bit lines BL corresponding to two storage cells 14 are connected to exactly the same column decoding circuit, two errors occur simultaneously at the same readout time point. For example, in FIG. 2, errors occur at the storage cell 91 and the storage cell 92 (91 and 92 in FIG. 1 represent capacitors, 91 and 92 in FIG. 2 represent storage cells, the storage cells usually include capacitors and transistors, which are marked as the same here to illustrate adjacent two bit errors in conjunction with FIG. 1 and FIG. 2) simultaneously. The corresponding bit line BL2 and bit line BL3 transmit their data to the local data line LIO:O<3:0> and the local data line LIO:E<3:0> through the column select signal unit CSL<n>, then, the data is transmitted to the YIO:E<3:0> and the YIO:O<3:0> through the local switch circuits, and thus, two bit errors enter the error checking and correcting unit 15 at the same time. The currently used ECC technology (for example, the ECC technology for 128 bits (data bits)+8 bits (check bits) can only implement one-bit correction) cannot correct the above two bit errors.

In order to solve the above problems, the embodiments of the present disclosure provide a memory. The memory includes a first error checking and correcting unit and a second error checking and correcting unit. The arrangement of the two error checking and correcting units enable that when a half bank outputs two data errors at the same time, the data errors can be corrected, thereby improving the error checking and correcting ability of the memory, and improving the reading and writing performance of the memory.

In order to make the objectives, technical solutions and advantages of the embodiments of the present disclosure clearer, the embodiments of the present disclosure will be described in detail below in conjunction with the accompanying drawings. However, those ordinary skilled in the art can understand that in the embodiments of the present disclosure, many technical details are proposed for readers to better understand the present disclosure. However, even without these technical details and various changes and modifications based on the following embodiments, the technical solutions claimed in the present disclosure can also be implemented.

Figure 3:
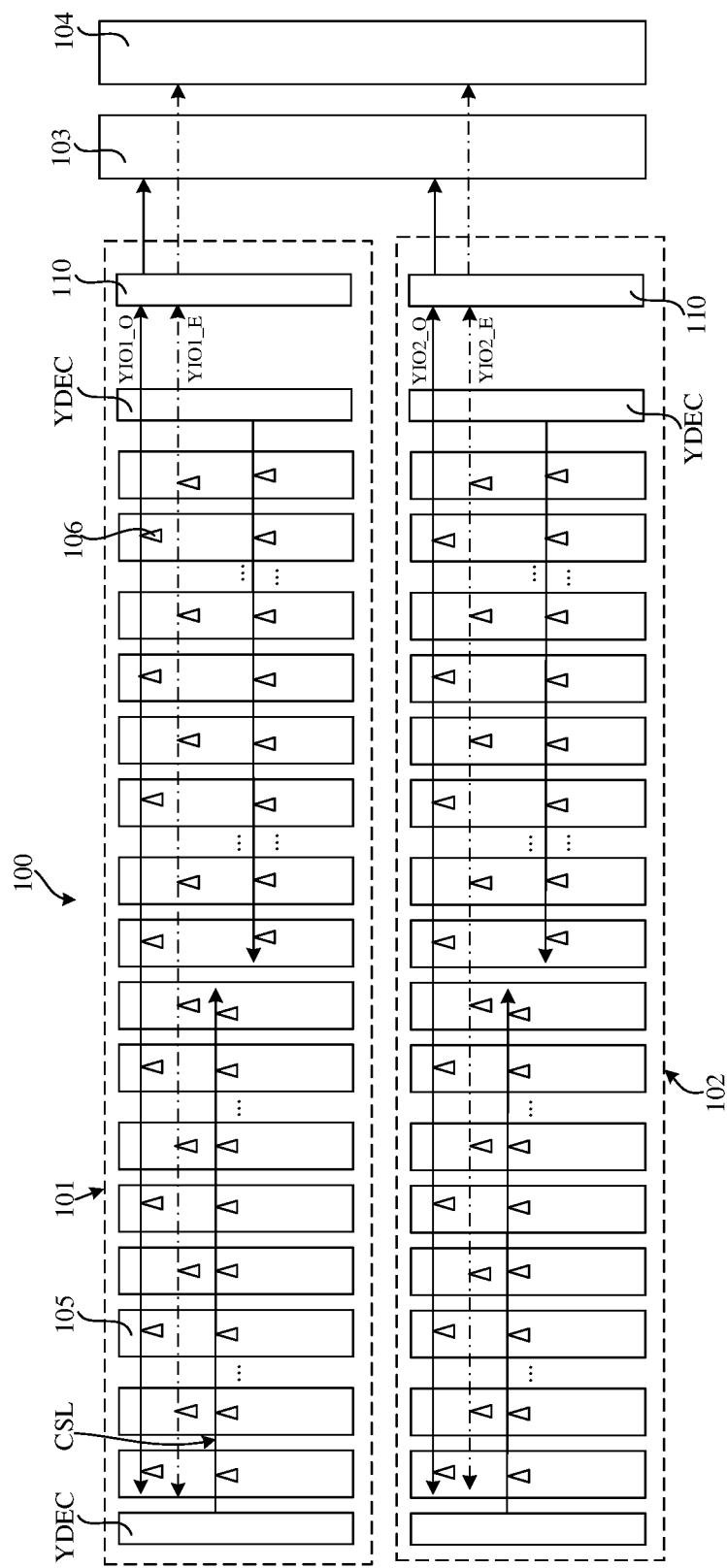
FIG. 3 is a structural schematic diagram of a memory provided by an embodiment of the present disclosure.

FIG. 3 is a structural schematic diagram of a memory provided by an embodiment of the present disclosure.

Referring to FIG. 3, in this embodiment, the memory includes:

multiple banks 100, each bank includes a U half bank 101 and a V half bank 102;

a first error checking and correcting unit 103 connected with the U half banks 101 and the V half banks 102 and configured to check and correct errors of output data of the U half banks 101 and the V half banks 102; and a second error checking and correcting unit 104 connected with the U half banks 101 and the V half banks 102 and configured to check and correct errors of the output data of the U half banks 101 and the V half banks 102.

The memory provided by this embodiment will be described in detail below in conjunction with the drawings.

For ease of illustration and description, only one bank 100 is illustrated in FIG. 3 as an example. In present embodiment, the output data of the U half bank 101 correspond to upper bit data, and the output data of the V half bank 102 correspond to lower bit data. In other embodiments, the bank may also be configured as that: the output data of the U half bank correspond to lower bit data, and the output data of the V half bank correspond to upper bit data. It should be understood that the upper bit data and the lower bit data are relative, and the upper bit data and the lower bit data are clearly defined in comparison.

Both the U half bank 101 and the V half bank 102 include multiple storage arrays arranged in an array (referring to FIG. 1 and FIG. 2). In present embodiment, taking 68 bits of output data of the U half bank 101 as an example, herein 64 bits of data are valid data (the data that the memory needs to interact with an external controller through a memory interface), and 4 bits of data are check bits generated after processing by the first error checking and correcting unit 103 and/or the second error checking and correcting unit 104.

It should be understood that the memory includes a data writing operation and a data reading operation. When the data writing operation is performed on the storage arrays in the memory, the data received by the memory interface is processed by an ECC module (such as the first error checking and correcting unit 103 and the second error checking and correcting unit 104 in FIG. 3).

For example, the data entering the ECC module are 64 bits of data, and the 64 bits of data are also called valid data. The data output by the ECC module are 68 bits (64 bits+4 bits) of data in which 64 bits of data are valid data and 4 bits are check bits generated by the ECC module. These 68 bits are all stored in the storage arrays of the U half bank 101. The operations for the writing data performed by the ECC module can be referred to as an encoding process.

When the data reading operation is performed on the storage arrays in the memory, the U half bank 101 also outputs 68 bits (64 bits+4 bits) of data. These 68 bits enter the ECC module simultaneously, and the ECC module executes an algorithm opposite to that of the writing operation. The operations for the reading data performed by the ECC module can be referred to as a decoding process. The ECC module performs a decoding operation on 64 bits of valid data and compares the result generated by the decoding operation with the 4 check bits, then whether the output 64 bits of valid data have errors is determined. If only 1 bit in 64 bits has an error (one-bit error), the ECC module may also correct the one-bit error.

Continuing to refer to FIG. 3, in present embodiment, for example, the U half bank 101 outputs 68 bits (64 bits+4 bits) of output data to the first error checking and correcting unit 103, and the V half bank 102 also outputs 68 bits (64 bits+4 bits) of output data to the first error checking and correcting unit 103; and the U half bank 101 outputs 68 bits (64 bits+4 bits) of output data to the second error checking and correcting unit 104, and the V half bank 102 also outputs 68 bits (64 bits+4 bits) of output data to the second error checking and correcting unit 104.

A comparative embodiment is provided, the U half bank 101 outputs 136 bits (128 bits+8 bits) of output data to the first error checking and correcting unit 103, and the V half bank 102 outputs 136 bits (128 bits+8 bits) of output data to the second error checking and correcting unit 104.

In comparison, part of the output data of the U half bank 101 (or the V half bank 102) are input into the first error checking and correcting unit 103 for checking and correcting errors, and the remaining output data are input into the second error checking and correcting unit 104 for checking and correcting errors, so that when more than one error occurs (such as two bit errors) in the output data of the U half bank 101 (or the V half bank 102) at the same time, different errors can be corrected by the first error checking and correcting unit 103 or the second error checking and correcting unit 104. Therefore, the memory can correct more than one error, and the error checking and correcting ability of the memory is improved.

In this embodiment, the input bits number of the first error checking and correcting unit 103 is the same as the input bits number of the second error checking and correcting unit 104. In an example, the input bits number of the first error checking and correcting unit 103 and the input bits number of the second error checking and correcting unit 104 are both 64 bits+4 bits. 64 bits are valid data written or read by the U half bank 101 or the V half bank 102, and 4 bits are the input bits of the first error checking and correcting unit 103 or the check bits generated by the second error checking and correcting unit 104.

Furthermore, the first error checking and correcting unit 103 has a same internal error checking algorithm as the second error checking and correcting unit 104, which helps to reduce the difficulty of the memory design.

Taking the first error checking and correcting unit 103 as an example, each time the data is written, the first error checking and correcting unit 103 uses the internal error checking algorithm to calculate the valid data (64 bits) to obtain check bits (4 bits) marked as first check bits. Then, the valid data (64 bits) and the check bits (4 bits) are written into the storage arrays 105 simultaneously. When these data are read from the storage arrays 105, the same algorithm is used to calculate the valid data (64 bits) again to obtain check bits (4 bits) marked as second check bits. The second check bits are compared with the first check bits read directly, if the result is the same, it means that the data are correct, otherwise it means that there is an error, and the first error checking and correcting unit 103 can logically check the error. When only one bit error occurs, the first error checking and correcting unit 103 can correct the error without affecting the reading operation of the memory. For example, when "0" appearing in the third bit in 64 bits is an error bit, the first error checking and correcting unit 103 corrects "0" in the third bit to "1".

The working principle of the second error checking and correcting unit 104 refers to that of the first error checking and correcting unit 103, and will not be elaborated below.

In some embodiments, part of the output data in the U half bank 101 are input into the first error checking and correcting unit 103 for checking and correcting errors, and the remaining output data are input into the second error checking and correcting unit 104 for checking and correcting errors. In this way, adjacent two bit errors that may occur in the same U half bank 101 are placed in different ECC units respectively. The two error data are processed by the first error checking and correcting unit 103 and the second error checking and correcting unit 104 respectively, that is, each of the first error checking and correcting unit 103 and the second error checking and correcting unit 104 only processes one error, but at the level of the memory, the memory can correct the two errors at the same time.

The error checking and correcting mechanism when an error occurs in the V half bank 102 can refer to the corresponding description of the U half bank 101, and will not be elaborated here.

In present embodiment, the storage capacity of the U half bank 101 is the same as the storage capacity of the V half bank 102. In other embodiments, the storage capacity of the U half bank may also be greater than or less than the storage capacity of the V half bank. For example, for an 8 Gbit DRAM chip, there are a total of 16 banks 100, and each bank 100 includes two half banks, so the storage capacity of one U half bank 101 and one V half bank 102 may both be 256 Mbit.

Figure 4:
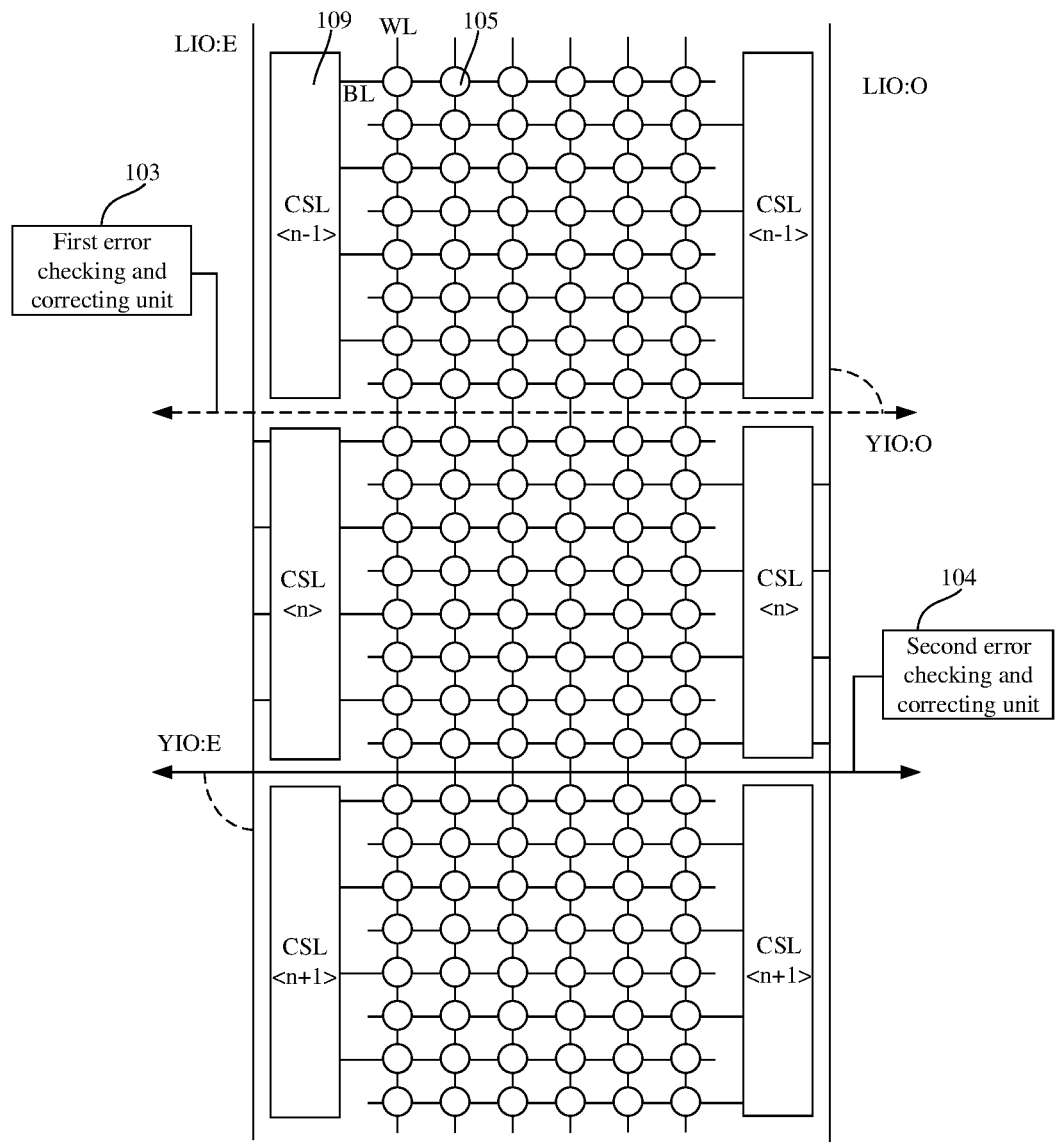
FIG. 4 is a schematic diagram of signal lines connection in a local region of a memory in FIG. 3.

With reference to FIG. 3 and FIG. 4, FIG. 4 is a schematic diagram of signal lines connection in a local region represented by a triangle 106 in a memory in FIG. 3. Local data buses LIO are connected with an even number of sensitive amplifiers (not illustrated) through column select signal units 109, and the sensitive amplifiers and the bit lines BL of the storage arrays 105 are disposed in one-to-one correspondence. The column select signal units 109 include gating switches, and Column Select Signals (CSS) control the gating switches to be switched on or off. When the gating switches are switched on, the sensitive amplifiers and the local data buses LIO perform data interaction. When the gating switches are switched off, the sensitive amplifiers and the local data buses do not perform data interaction.

Furthermore, the output data on adjacent bit lines BL enter local data buses O and local data buses E through the sensitive amplifiers and the column select signal units 109 respectively. For the convenience of distinction, in FIG. 4, LIO:E indicates the local data buses E, LIO:O indicates the local data buses O, CSL<n−1>, CSL<n> and CSL<n+1> indicate the column select signal units, the gating switches are located in the column select signal units (not illustrated), and the sensitive amplifiers are located on two sides of the bit lines BL (not illustrated). The local data buses E and block data buses E perform data interaction through local switch circuits (not illustrated), and the local data buses O and block data buses O perform data interaction through local switch circuits (not illustrated). In FIG. 4, a solid line YIO:E with arrows indicates the block data buses E, and a solid line YIO:O with arrows indicates the block data buses O.

Continuing to refer to FIG. 3, YIO1_O indicates one of block data buses O, and YIO1_E indicates one of block data buses E. In an embodiment, YIO:E in FIG. 4 may be understood as YIO1_E, and YIO:O in FIG. 4 may be understood as YIO1_O. In an embodiment, one YIO1_O or YIO1_E may be connected with the YIO:O or YIO:E of multiple storage arrays 105. The YIO1_O is connected to the first error checking and correcting unit 103 through a block amplifier 110, and the YIO1_E is connected to the second error checking and correcting unit 104 through a block amplifier 110.

Continuing to refer to FIG. 3, the data of the YIO_O enter the first error checking and correcting unit 103, and the data of the YIO_E enter the second error checking and correcting unit 104. In this embodiment, the U half bank 101 includes local switch circuits (Local SA, not illustrated) and an even number of local data buses, and the V half bank 102 includes local switch circuits (not illustrated) and an even number of local data buses. The local data buses are divided into local data buses O and local data buses E, the local data buses O are connected with respective block data buses O through local switch circuits, and the local data buses E are connected with respective block data buses E through local switch circuits.

It should be understood that the local data buses are sequentially numbered from zero according to natural numbers, odd-numbered local data buses are defined as the local data buses O, and the even-numbered local data buses are defined as the local data buses E. In other words, in the local data buses corresponding to the storage arrays with adjacent physical locations, the local data buses in odd locations are defined as the local data buses O, and the local data buses in even locations are defined as the local data buses E.

Since physically adjacent data are placed in different error checking and correcting units, that is, the physically adjacent data enter the first error checking and correcting unit 103 and the second error checking and correcting unit 104 respectively, when adjacent two bit errors occur, since the two bit errors are corrected in different error checking and correcting units respectively, the two bit errors can be processed at the same time. It should be understood that even if the process size continues to reduce and the risk of occurring bridge connection between adjacent capacitors increases, since the data corresponding to adjacent capacitors enter different error checking and correcting units for correcting errors, it can still be ensured that the errors of physically adjacent two bit data can be corrected.

In other words, in some embodiments, the memory includes a storage array, multiple column select signal units, local data buses, a first error checking and correcting unit, and a second error checking and correcting unit. The storage array includes multiple bit lines, and each of the multiple bit lines is connected to multiple storage cells in the storage array. The multiple column select signal units are connected to sensitive amplifiers, and the sensitive amplifiers and the multiple bit lines are disposed in one-to-one correspondence. The local data buses are divided into local data buses O and local data buses E, and adjacent bit lines are electrically connected to a respective local data bus O and a respective local data bus E, respectively, through a respective sensitive amplifier and a respective column select signal unit. The first error checking and correcting unit and the second error checking and correcting unit are configured to check and correct errors of data. The local data buses O are electrically connected to the first error checking and correcting unit, and the local data buses E are electrically connected to the second error checking and correcting unit; or the local data buses E are electrically connected to the first error checking and correcting unit, and the local data buses O are electrically connected to the second error checking and correcting unit.

In some examples, each of at least one of the multiple storage cells includes a capacitor and a transistor. The transistor has an active region electrically connected to the capacitor, and capacitors in two storage cells which are connected to adjacent bit lines are located on opposite sides of the same word line respectively. The capacitors in the two storage cells which are respectively located on the opposite sides of the same word line correspond to adjacent active regions.

Continuing to refer to FIG. 3, column decoding circuits YDEC and the column select signal CSL generated by the column decoding circuits YDEC are illustrated. The column select signal line CSL is electrically connected with multiple storage arrays 105, and the storage array 105 for a storage operation is selected through the column select signal line CSL. Continuing to refer to FIG. 4, in an embodiment, the column select signal line CSL corresponds to CSL<n−1>, CSL<n> and CSL<n+1> in FIG. 4.

Continuing to refer to FIG. 3, the storage arrays 105 in the U half bank 101 are numbered from 1 according to natural numbers, and the block data buses are electrically connected with even-numbered storage arrays 105. In some embodiments, the storage arrays 105 include storage cells, local data buses E, local data buses O and local switch circuits. The block data buses are connected with the local data buses E through the local switch circuits, and the block data buses are connected with the local data buses O through the local switch circuits. In FIG. 3, the connection relationship between the block data buses and the storage arrays 105 is indicated by triangular symbols. The description of the connection relationship of the block data buses of the V half bank 102 refers to the corresponding description of the U half bank 101, and will not be elaborated below.

In present embodiment, in order to reduce the length of the column select signal line CSL1 to reduce the parasitic resistance of the column select signal line CSL1 so as to reduce the power consumption, for the U half bank 101, the column decoding circuits YDEC are located on two opposite sides of multiple storage arrays 105 respectively, and for the V half bank 102, the column decoding circuits YDEC are located on two opposite sides of multiple storage arrays 105 respectively. It should be noted that in other embodiments, for each U half bank or each V half bank, the number of the column decoding circuits may also be one.

It should be understood that in an example, the number of block data buses are 2*4*(16*N), the number of local data buses are 2*4*M*(16*N); the number of block data buses O are 4*(16*N), the number of block data buses E are 4*(16*N); the number of local data buses O are 4*M*(16*N), and the number of local data buses E are 4*M*(16*N). One block data bus O corresponds to M local data buses O, and one block data bus E corresponds to M local data buses E. The local data buses are divided into M*(16*N) groups of local data buses O and M*(16*N) groups of local data buses E by taking 4 adjacent local data buses as one group. M and N are natural numbers greater than or equal to 1. Taking M and N both equal to 1 as an example, the number of block data buses are 2*4*16, the number of local data buses are 2*4*16, the number of block data buses O are 4*16, the number of block data buses E are 4*16, the number of local data buses O are 4*16, the number of local data buses E are 4*16, and there are a total of 16 groups of local data buses O and 16 groups of local data buses E.

In an example, as illustrated in FIG. 3, the U half bank 101 includes an even number of block data buses, the block data buses are sequentially numbered from zero according to natural numbers, the odd-numbered block data buses O (marked as YIO1_O) are connected with the first error checking and correcting unit 103, and the even-numbered block data buses E (marked as YIO1_E) are connected with the second error checking and correcting unit 104. The V half bank 102 includes an even number of block data buses, the block data buses are sequentially numbered from zero according to natural numbers, the odd-numbered block data buses O (marked as YIO2_O) are connected with the first error checking and correcting unit 103, and the even-numbered block data buses E (marked as YIO2_E) are connected with the second error checking and correcting unit 104.

In this way, the data of the block data buses O (YIO1_O) of the U half bank 101 and the data of the block data buses O (YIO2_O) of the V half bank 102 enter the first error checking and correcting unit 103 for checking and correcting errors. The data of the block data buses E (YIO1_E) of the U half bank 101 and the data of the block data buses E (YIO2_E) of the V half bank 102 enter the second error checking and correcting unit 104 for checking and correcting errors.

Figure 5:
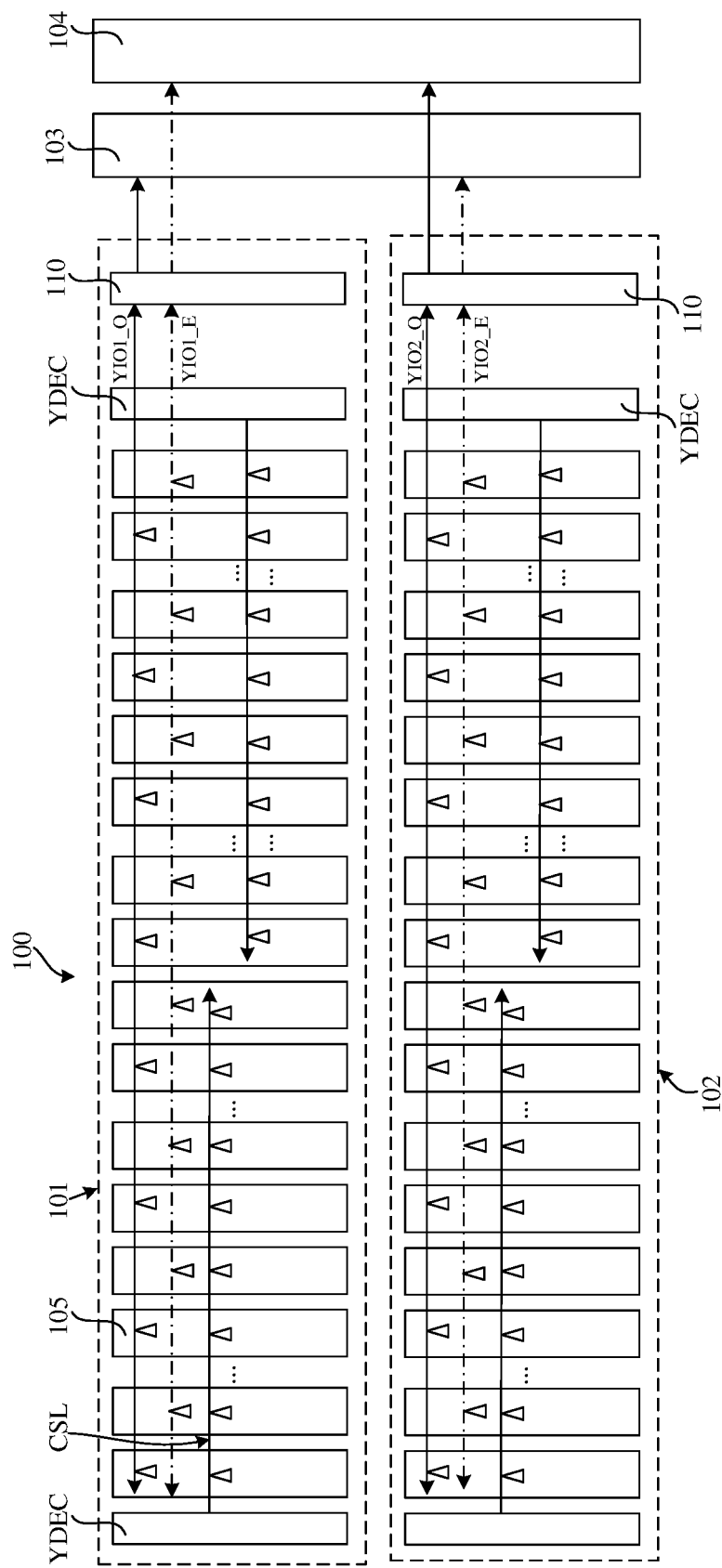
FIG. 5 is another structural schematic diagram of a memory provided by an embodiment of the present disclosure.

In another example, as illustrated in FIG. 5, the U half bank 101 includes an even number of block data buses. The block data buses are sequentially numbered from zero according to natural numbers, the odd-numbered block data buses O (YIO1_O) are connected with the first error checking and correcting unit 103, and the even-numbered block data buses E (YIO1_E) are connected with the second error checking and correcting unit 104. The V half bank 102 includes an even number of block data buses, the block data buses are sequentially numbered from zero according to natural numbers, the odd-numbered block data buses O (YIO2_O) are connected with the second error checking and correcting unit 104, and the even-numbered block data buses E (YIO2_E) are connected with the first error checking and correcting unit 103.

Continuing to refer to FIG. 5, the data of the block data buses O (YIO1_O) of the U half bank 101 and the data of the block data buses E (YIO2_E) of the V half bank 102 enter the first error checking and correcting unit 103 for checking and correcting errors; and the data of the block data buses E (YIO1_E) of the U half bank 101 and the data of the block data buses O (YIO2_O) of the V half bank 102 enter the second error checking and correcting unit 104 for checking and correcting errors.

Figure 6:
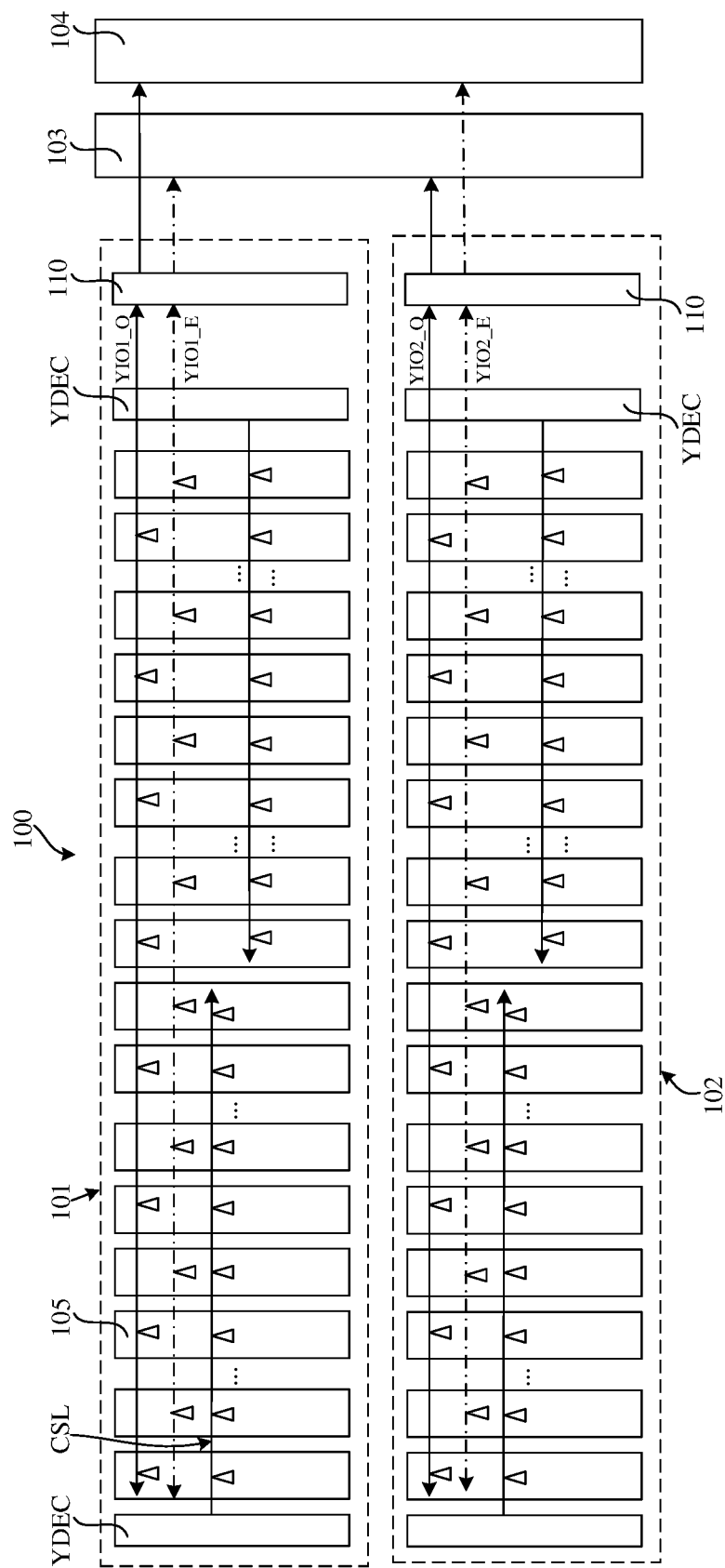
FIG. 6 is another structural schematic diagram of a memory provided by an embodiment of the present disclosure.

In another example, as illustrated in FIG. 6, the U half bank 101 includes an even number of block data buses. The block data buses are sequentially numbered from zero according to natural numbers, the odd-numbered block data buses O (YIO1_O) are connected with the second error checking and correcting unit 104, and the even-numbered block data buses E (YIO1_E) are connected with the first error checking and correcting unit 103. The V half bank 102 includes an even number of block data buses, the block data buses are sequentially numbered from zero according to natural numbers, the odd-numbered block data buses O (YIO2_O) are connected with the first error checking and correcting unit 103, and the even-numbered block data buses E (YIO2_E) are connected with the second error checking and correcting unit 104.

Continuing to refer to FIG. 6, the data of the block data buses E (YIO1_E) of the U half bank 101 and the data of the block data buses O (YIO2_O) of the V half bank 102 enter the first error checking and correcting unit 103 for checking and correcting errors; and the data of the block data buses O (YIO1_O) of the U half bank 101 and the data of the block data buses E (YIO2_E) of the V half bank 102 enter the second error checking and correcting unit 104 for checking and correcting errors.

Figure 7:
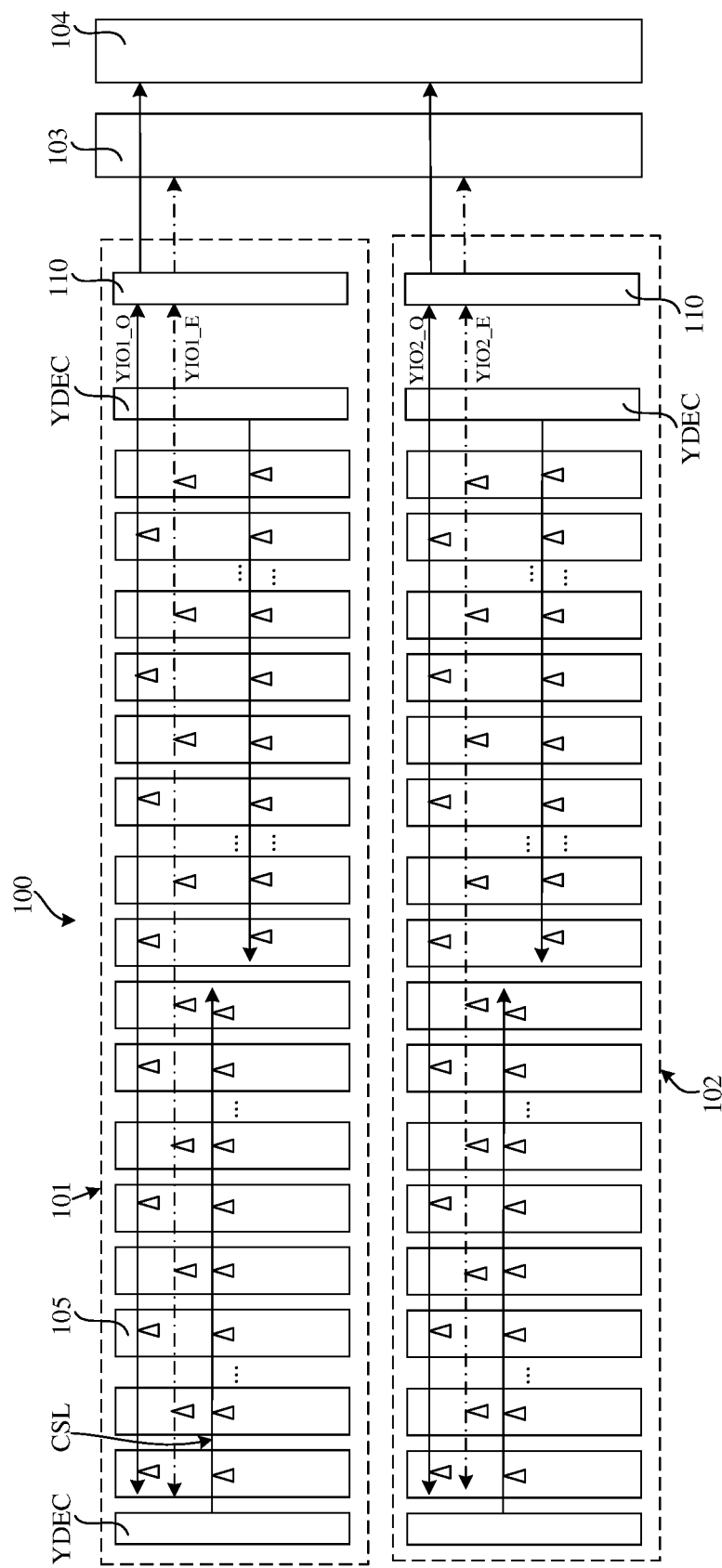
FIG. 7 is another structural schematic diagram of a memory provided by an embodiment of the present disclosure.

In another example, as illustrated in FIG. 7, the U half bank 101 includes an even number of block data buses. The block data buses are sequentially numbered from zero according to natural numbers, the odd-numbered block data buses O (YIO1_O) are connected with the second error checking and correcting unit 104, and the even-numbered block data buses E (YIO1_E) are connected with the first error checking and correcting unit 103. The V half bank includes an even number of block data buses. The block data buses are sequentially numbered from zero according to natural numbers, the odd-numbered block data buses O (YIO2_O) are connected with the second error checking and correcting unit 104, and the even-numbered block data buses E (YIO2_E) are connected with the first error checking and correcting unit 103.

Continuing to refer to FIG. 7, the data of the block data buses E of the U half bank 101 and the data of the block data buses E of the V half bank 102 (YIO1_E and YIO2_E) enter the first error checking and correcting unit 103 for checking and correcting errors. The data of the block data buses O of the U half bank 101 and the data of the block data buses O of the V half bank 102 (YIO1_O and YIO2_O) enter the second error checking and correcting unit 104 for checking and correcting errors.

According to the memory provided by present embodiment, since the output data of the same half bank are input into different error checking and correcting units respectively, that is, part of the output data are input into the first error checking and correcting unit 103 for checking and correcting errors, and the remaining output data are input into the second error checking and correcting unit 104 for checking and correcting errors, if there are two bit data errors at the same time, the first error checking and correcting unit 103 and the second error checking and correcting unit 104 can respectively correct one bit of data in the two bits. Therefore the error checking and correcting ability of the memory may be improved.

Another embodiment of the present disclosure further provides a memory. The memory is substantially the same as the memory provided by the previous embodiment, and the main difference includes: in present embodiment, the output data of the U half bank include upper bit data and lower bit data, and the output data of the V half bank include upper bit data and lower bit data. The memory provided by present embodiment of the present disclosure will be described in detail below in conjunction with the drawings. It should be understood that the parts that are the same as or corresponding to the above embodiment refer to the detailed descriptions of the above embodiment, and will not be elaborated below.

Figure 8:
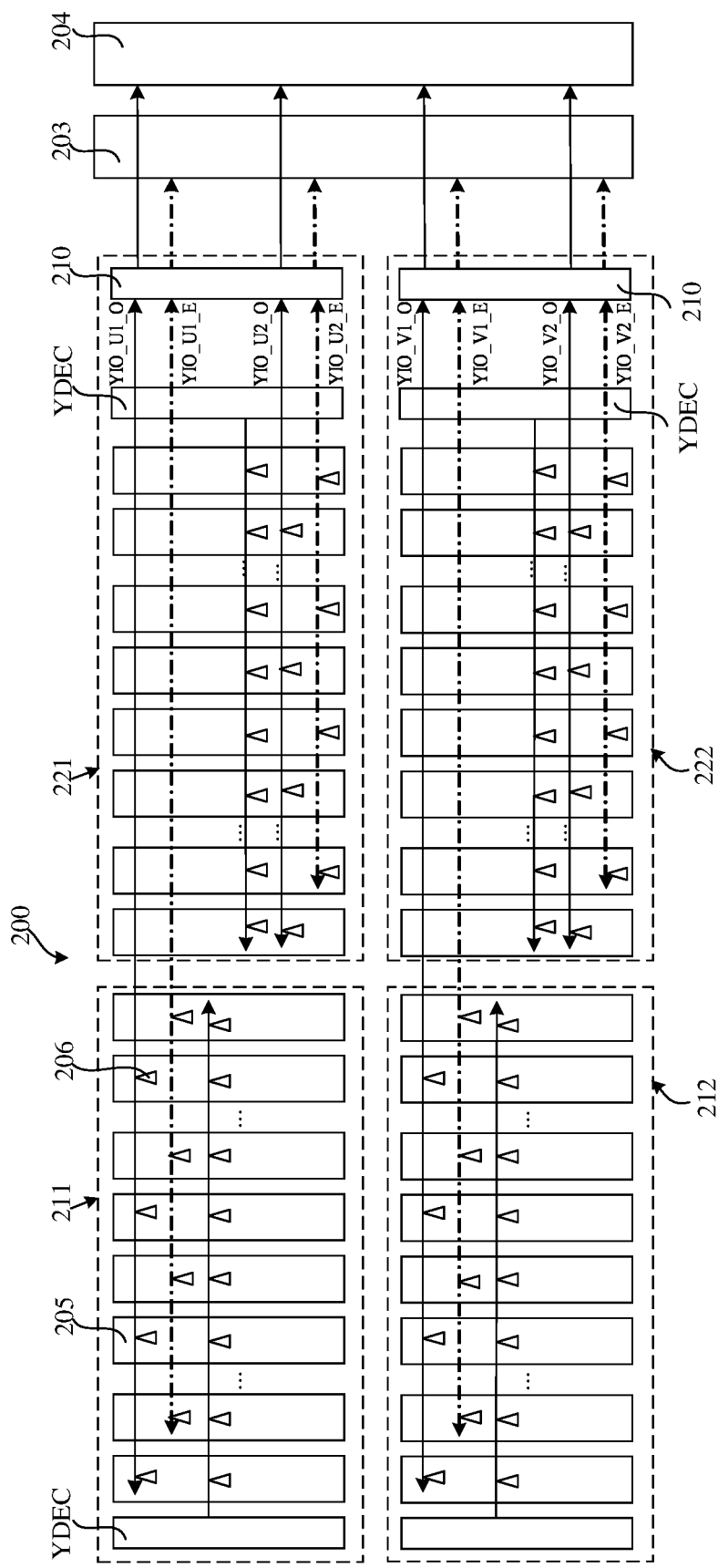
FIG. 8 is a structural schematic diagram of a memory provided by another embodiment of the present disclosure.
Figure 9:
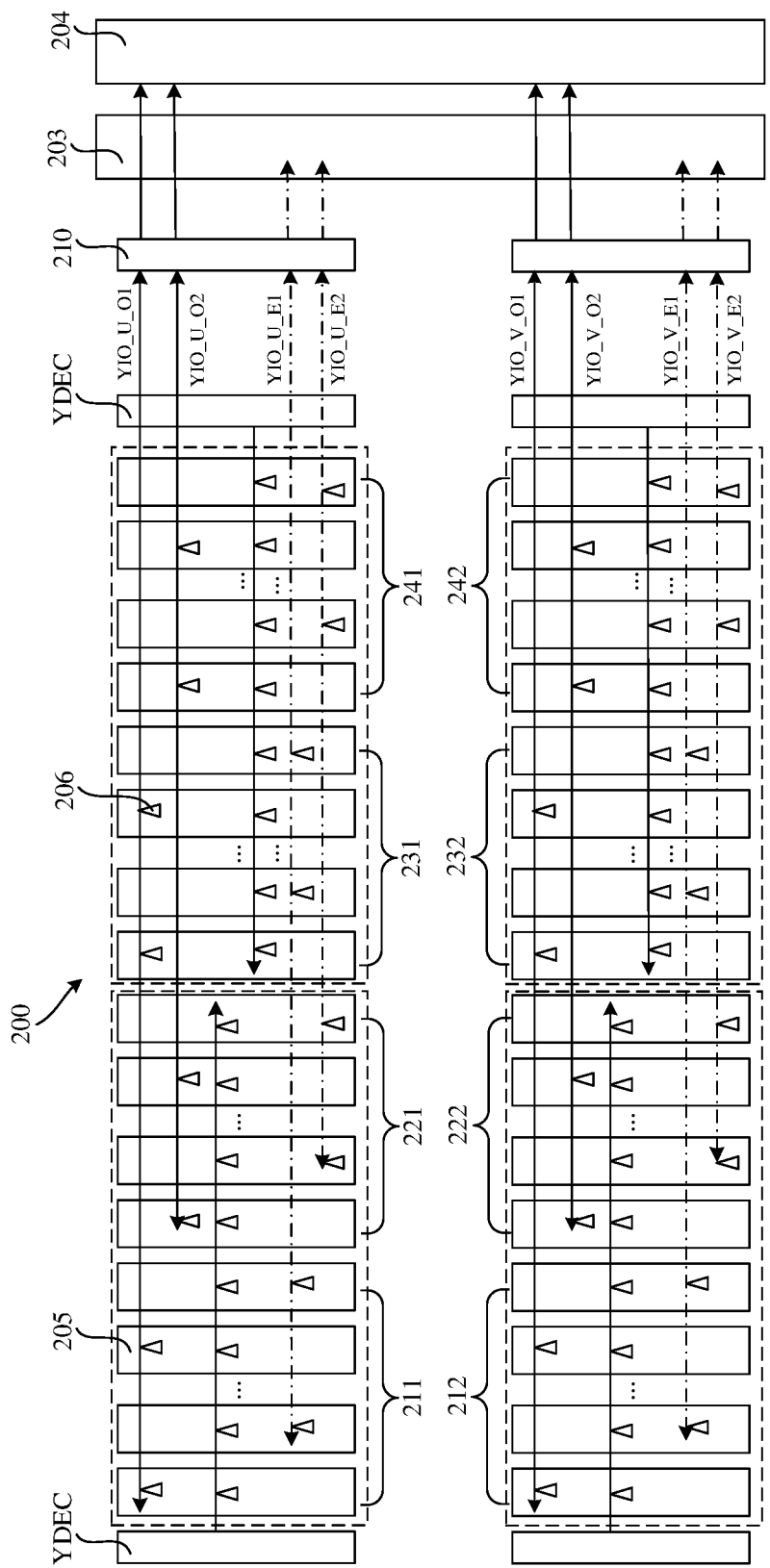
FIG. 9 is another structural schematic diagram of a memory provided by another embodiment of the present disclosure.

FIG. 8 is a structural schematic diagram of a memory provided by another embodiment of the present disclosure. FIG. 9 is another structural schematic diagram of a memory provided by another embodiment of the present disclosure.

Referring to FIG. 8, in this embodiment, the memory includes: multiple banks 200, each bank includes a U half bank and a V half bank, a first error checking and correcting unit 203, and a second error checking and correcting unit 204.

The memory further includes column decoding circuits YDEC and block amplifiers 210. The bank 200 includes multiple storage arrays 205. In an example, part of the output data of the U half bank correspond to upper bit data, and the remaining output data correspond to lower bit data; and part of the output data of the V half bank correspond to upper bit data, and the remaining output data correspond to lower bit data. In an example, half of the output data of the U half bank correspond to upper bit data, and the other half of the output data correspond to lower bit data; and half of the output data of the V half bank correspond to upper bit data, and the other half of the output data correspond to lower bit data.

In this way, since the output data of the U half bank include lower bit data and upper bit data, a single access will only access part of the storage arrays in the U half bank, so as to reduce the power consumption of the memory. Similarly, since the output data of the V half bank include lower bit data and upper bit data, a single access will only access part of the storage arrays in the V half bank, so as to be also favorable for reducing the power consumption of the memory.

In an example, as illustrated in FIG. 8, a U half bank includes a first U half bank 211 and a second U half bank 221. The output data of the first U half bank 211 are upper bit data, and the output data of the second U half bank 221 are lower bit data. The V half bank includes a first V half bank 212 and a second V half bank 222. The output data of the first V half bank 212 are upper bit data, and the output data of the second V half bank 222 are lower bit data.

The U half bank includes block data buses, which include block data buses YIO_U1_O (odd numbers) and block data buses YIO_U1_E (even numbers) corresponding to the first U half bank 211, and block data buses YIO_U2_O (odd numbers) and block data buses YIO_U2_E (even numbers) corresponding to the second U half bank 221. The V half bank includes block data buses, which include block data buses YIO_V1_O (odd numbers) and block data buses YIO_V1_E (even numbers) corresponding to the first V half bank 212, and block data buses YIO_V2_O (odd numbers) and block data buses YIO_V2_E (even numbers) corresponding to the second V half bank 222. The block data buses YIO_U1_E, the block data buses YIO_U2_E, the block data buses YIO_V1_E and the block data buses YIO_V2_E are connected with the first error checking and correcting unit 203. The block data buses YIO_U1_O, the block data buses YIO_U2_O, the block data buses YIO_V1_O and the block data buses YIO_V2_O are connected with the second error checking and correcting unit 204. Triangles 206 in FIG. 8 indicate that the block data buses are electrically connected with the corresponding storage arrays 205.

Continuing to refer to FIG. 8, an embodiment is provided. For example, 34 bits (32 bits of valid data+2 check bits, corresponding to the block data buses YIO_U1_E) of the first U half bank 211, 34 bits (32 bits of valid data+2 check bits, corresponding to the block data buses YIO_U2_E) of the second U half bank 221, 34 bits (32 bits of valid data+2 check bits, corresponding to the block data buses YIO_V1_E) of the first V half bank 212 and 34 bits (32 bits of valid data+2 check bits, corresponding to the block data buses YIO_V2_E) of the second V half bank 222, a total of 136 bits (128 bits of valid data+8 check bits), are input into the first error checking and correcting unit 203. 34 bits (32 bits of valid data+2 check bits, corresponding to the block data buses YIO_U1_O) of the first U half bank 211, 34 bits (32 bits of valid data+2 check bits, corresponding to the block data buses YIO_U2_O) of the second U half bank 221, 34 bits (32 bits of valid data+2 check bits, corresponding to the block data buses YIO_V1_O) of the first V half bank 212 and 34 bits (32 bits of valid data+2 check bits, corresponding to the block data buses YIO_V2_O) of the second V half bank 222, a total of 136 bits (128 bits of valid data+8 check bits), are input into the second error checking and correcting unit 204. Since the output data of the same half bank (such as the first U half bank 211) are input into different error checking and correcting units respectively, that is, part of the output data are input into the first error checking and correcting unit 203 for checking and correcting errors, and the remaining output data are input into the second error checking and correcting unit 204 for checking and correcting errors, if there are two bit data errors at the same time, the first error checking and correcting unit 203 and the second error checking and correcting unit 204 can correct one bit of data in the two bits respectively, so as to improve the error checking and correcting ability of the memory.

In another example, as illustrated in FIG. 9, a U half bank includes a first U half bank 211, a second U half bank 221, a third U half bank 231 and a fourth U half bank 241 which are sequentially arranged. The output data of the first U half bank 211 and the third U half bank 231 are upper bit data, and the output data of the second U half bank 221 and the fourth U half bank 241 are lower bit data. The V half bank includes a first V half bank 212, a second V half bank 222, a third V half bank 232 and a fourth V half bank 242 which are sequentially arranged. The output data of the first V half bank 212 and the third V half bank 232 are upper bit data, and the output data of the second V half bank 222 and the fourth V half bank 242 are lower bit data. Triangles 206 in FIG. 9 indicate that the block data buses are electrically connected with the corresponding storage arrays 205.

As described in the previous embodiment, the block data buses corresponding to the U half bank are divided into block data buses YIO_U_O1, block data buses YIO_U_O2, block data buses YIO_U_E1 and block data buses YIO_U_E2 according to odd and even locations. The block data buses corresponding to the V half bank are divided into block data buses YIO_V_O1, block data buses YIO_V_O2, block data buses YIO_V_E1 and block data buses YIO_V_E2 according to odd and even locations. The block data buses YIO_U_O1 are connected with the first U half bank 211 and the third U half bank 231, and the block data buses YIO_U_O2 are connected with the second U half bank 221 and the fourth U half bank 241. The block data buses YIO_V_O1 are connected with the first V half bank 212 and the third V half bank 232, and the block data buses YIO_V_O2 are connected with the second V half bank 222 and the fourth V half bank 242.

The connection relationship between the block data buses corresponding to the U half bank and the V half bank and the first error checking and correcting unit 203 and the second error checking and correcting unit 204 refers to the description of the above embodiment, and will not be elaborated here.

Compared with the above embodiment, the memory provided by present embodiment can correct errors of two bits at the same time. Moreover, since part of the output data in the U half bank and the V half bank are upper bit data, and the remaining output data are lower bit data, during a single access to the memory, only part of the storage arrays in the U half bank or the V half bank are accessed, so as to be favorable for reducing the power consumption of the memory.

Those ordinary skilled in the art can understand that the above embodiments are exemplarily embodiments for implementing the present disclosure. In practical applications, various changes can be made in forms and details without departing from the spirit and scope of the present disclosure. Any person skilled in the art can make changes and modifications without departing from the spirit and scope of the present disclosure. Therefore, the protection scope of the present disclosure shall be subject to the scope defined by the claims.

The invention claimed is:

1. A memory, comprising a U half bank and a V half bank, wherein each of the U half bank and the V half bank comprises:
   a storage array, wherein the storage array comprises a plurality of bit lines, and each of the plurality of bit lines is connected to a plurality of storage cells in the storage array;
   a plurality of column select signal units, wherein the plurality of column select signal units are connected to sensitive amplifiers, and the sensitive amplifiers and the plurality of bit lines are disposed in one-to-one correspondence; and
   local data buses, wherein the local data buses are divided into local data buses O and local data buses E, and adjacent bit lines are electrically connected to a respective local data bus O and a respective local data bus E, respectively, through a respective sensitive amplifier and a respective column select signal unit;
   wherein each of the U half bank and V half bank is configured by the local data buses O and local data buses E to output both high bit data and low bit data, and wherein the memory further comprises:
   a first error checking and correcting unit and a second error checking and correcting unit that are configured to check and correct errors of data, wherein the local data buses O are electrically connected to the first error checking and correcting unit, and the local data buses E are electrically connected to the second error checking and correcting unit; or the local data buses E are electrically connected to the first error checking and correcting unit, and the local data buses O are electrically connected to the second error checking and correcting unit.

2. The memory of claim 1, wherein data on the adjacent bit lines enters the respective local data bus O and the respective local data bus E, respectively, through the respective sensitive amplifier and the respective column select signal unit.

3. The memory of claim 2, wherein the plurality of column select signal units are located on opposite sides of the storage array, a respective local data bus O is electrically connected to a bit line of the plurality of bit lines through a respective column select signal unit on one side of the storage array, and a respective local data bus E is electrically connected to another bit line of the plurality of bit lines through a respective column select signal unit on the other side of the storage array.

4. The memory of claim 1, further comprising:
   block data buses E, configured to interact data with the local data buses E; and
   block data buses O, configured to interact data with the local data buses O;
   wherein the local data buses O are electrically connected to the first error checking and correcting unit through the block data buses O, and the local data buses E are electrically connected to the second error checking and correcting unit through the block data buses E; or the local data buses O are electrically connected to the second error checking and correcting unit through the block data buses O, and the local data buses E are electrically connected to the first error checking and correcting unit through the block data buses E.

5. The memory of claim 4, further comprising a local switch circuit; wherein the local data buses E are electrically connected to the block data buses E through the local switch circuit, and the local data buses O are electrically connected to the block data buses O through the local switch circuit.

6. The memory of claim 1, wherein data corresponding to physically adjacent local data buses enters the first error checking and correcting unit and the second error checking and correcting unit respectively.

7. The memory of claim 1, wherein each of the plurality of column select signal units comprises a gating switch, the gating switch is controlled to be switched on or off by a column select signal; the sensitive amplifier corresponding to the bit line is configured to interact data with a respective local data bus in a case where the gating switch is switched on; and the sensitive amplifier corresponding to the bit line is configured not to interact data with the respective local data bus in a case where the gating switch is switched off.

8. The memory of claim 1, further comprising:
   column decoding circuits configured to generate column select signals;
   wherein the column decoding circuits are located on opposite sides of a plurality of the storage arrays of the U half bank and the V half bank respectively, and each of the U half bank and the V half bank corresponds to different column decoding circuits.

9. The memory of claim 1, wherein the U half bank comprises an even number of block data buses, the block data buses are sequentially numbered from zero according to natural numbers, odd-numbered block data buses are block data buses O, even- numbered block data buses are block data buses E; the block data buses O are connected to the first error checking and correcting unit, and the block data buses E are connected to the second error checking and correcting unit; or the block data buses O are connected to the second error checking and correcting unit, and the block data buses E are connected to the first error checking and correcting unit.

10. The memory of claim 1, wherein the V half bank comprises an even number of block data buses, the block data buses are sequentially numbered from zero according to natural numbers, odd-numbered block data buses are block data buses O, even- numbered block data buses are block data buses E; the block data buses O are connected to the first error checking and correcting unit, and the block data buses E are connected to the second error checking and correcting unit; or the block data buses O are connected to the second error checking and correcting unit, and the block data buses E are connected to the first error checking and correcting unit.

11. The memory of claim 9, wherein each of the V half bank and the U half bank comprises a local switch circuit and an even number of local data buses, the even number of local data buses are divided into local data buses O and local data buses E, the local data buses O are connected to the block data buses O through the local switch circuit, and the local data buses E are connected to the block data buses E through the local switch circuit.

12. The memory of claim 9, wherein a number of the block data buses is $2*4*(16*N)$, a number of the local data buses is $2*4*M*(16*N)$; a number of the block data buses O is $4*(16*N)$, a number of the block data buses E is $4*(16*N)$; a number of the local data buses O is $4*M*(16*N)$, a number of the local data buses E is $4*M*(16*N)$; one of the block data buses O corresponds to M local data buses O, one of the block data buses E corresponds to M local data buses E; and the local data buses are divided into M*(16*N) groups of local data buses O and M*(16*N) groups of local data buses E by taking 4 adjacent local data buses as one group; wherein M and N are natural numbers greater than or equal to 1.

13. The memory of claim 1, wherein a storage capacity of the U half bank is the same as a storage capacity of the V half bank.

14. The memory of claim 1, wherein each of the local data buses is connected to an even number of sensitive amplifiers through gating switches, and the even number of sensitive amplifiers and the plurality of bit lines in the memory are disposed in one-to-one correspondence.

15. The memory of claim 14, wherein output data on two adjacent bit lines enters a respective local data bus O and a respective local data bus E, respectively, through a respective sensitive amplifier and a respective gating switch.

16. The memory of claim 1, wherein each of at least one of the plurality of storage cells comprises a capacitor and a transistor, and the transistor has an active region electrically connected to the capacitor; capacitors in two storage cells which are connected to adjacent bit lines are located on opposite sides of a same word line respectively, and the capacitors in the two storage cells which are respectively located on the opposite sides of the same word line correspond to adjacent active regions.

17. The memory of claim 1, wherein a number of input bits of the first error checking and correcting unit is the same as a number of input bits of the second error checking and correcting unit.

18. The memory of claim 1, wherein an internal error checking algorithm of the first error checking and correcting unit is the same as an internal error checking algorithm of the second error checking and correcting unit.

19. The memory of claim 1, wherein, during a single access, only a portion of the storage array in the U half bank is accessed, or only a portion of the storage array in the V half bank is accessed.

20. The memory of claim 1, wherein the local data buses O of the U half bank and the local data buses E of the V half bank are electrically connected to the first error checking and correcting unit, and the local data buses E of the U half bank and the local data buses O of the V half bank are electrically connected to the second error checking and correcting unit; or the local data buses O of the U half bank and the local data buses E of the V half bank are electrically connected to the second error checking and correcting unit, and the local data buses E of the U half bank and the local data buses O of the V half bank are electrically connected to the first error checking and correcting unit.

* * * * *